US008063958B2

(12) United States Patent
Okita et al.

(10) Patent No.: US 8,063,958 B2
(45) Date of Patent: Nov. 22, 2011

(54) SOLID STATE IMAGE PICKUP DEVICE WITH FIRST AND SECOND PHOTOELECTRIC CONVERSION REGIONS AND CARRIER ACCUMULATING UNITS CONNECTED IN PARALLEL TO EACH INPUT PORTION OF PLURAL AMPLIFYING UNITS

(75) Inventors: Akira Okita, Yamato (JP); Toru Koizumi, Yokohama (JP); Masanori Ogura, Atsugi (JP); Shin Kikuchi, Isehara (JP); Tetsuya Itano, Zama (JP)

(73) Assignee: Canon Kabushiki Kaisha, Tokyo (JP)

( * ) Notice: Subject to any disclaimer, the term of this patent is extended or adjusted under 35 U.S.C. 154(b) by 475 days.

(21) Appl. No.: 11/944,859

(22) Filed: Nov. 26, 2007

(65) Prior Publication Data

US 2008/0068480 A1    Mar. 20, 2008

Related U.S. Application Data

(63) Continuation of application No. 11/373,195, filed on Mar. 13, 2006, now Pat. No. 7,321,110.

(30) Foreign Application Priority Data

Mar. 18, 2005    (JP) ................................. 2005-080347

(51) Int. Cl.
*H04N 5/217*    (2006.01)
*H04N 3/14*    (2006.01)
(52) U.S. Cl. .......................... 348/241; 348/299; 348/300
(58) Field of Classification Search .................. 348/272, 348/294, 299–303, 307, 314, 241–254; 257/113, 257/230, 445; 250/208.1
See application file for complete search history.

(56) References Cited

U.S. PATENT DOCUMENTS

| 4,611,140 | A | * | 9/1986 | Whitlock et al. | ......... 310/313 B |
| 5,121,225 | A | | 6/1992 | Murata et al. | .................. 358/471 |
| 5,245,203 | A | | 9/1993 | Morishita et al. | ............. 257/113 |
| 5,261,013 | A | | 11/1993 | Murata et al. | ................... 382/65 |

(Continued)

FOREIGN PATENT DOCUMENTS

JP    2001-186414    7/2001

(Continued)

OTHER PUBLICATIONS

Machine English Translation for JP 2006-217410 A (Published: Aug. 17, 2006).*

(Continued)

*Primary Examiner* — Lin Ye
*Assistant Examiner* — Euel K Cowan
(74) *Attorney, Agent, or Firm* — Fitzpatrick, Cella, Harper & Scinto (57) ABSTRACT

An solid state image pickup device including a plurality of photoelectric conversion regions (PD1, PD2) for generating carriers by photoelectric conversions to accumulate the generated carriers, an amplifying unit for amplifying the carriers, being commonly provided to at least two photoelectric conversion regions, a first and a second transfer units (Tx-MOS1, Tx-MOS2) for transferring the carriers accumulated in the first and the second photoelectric conversion regions, respectively, a first and a second carrier accumulating units (Cs1, Cs2) for accumulating the carriers flowing out from the first and the second photoelectric conversion regions through a first and a second fixed potential barriers, respectively, and a third and a fourth transfer units (Cs-MOS1, Cs-MOS2) for transferring the carriers accumulated in the first and the second carrier accumulating units to the amplifying unit, respectively.

14 Claims, 9 Drawing Sheets

U.S. PATENT DOCUMENTS

| | | | |
|---|---|---|---|
| 5,352,920 A | 10/1994 | Morishita et al. | 257/435 |
| 5,475,211 A | 12/1995 | Ogura et al. | 250/208.1 |
| 5,483,281 A * | 1/1996 | Seto | 348/300 |
| 5,563,405 A | 10/1996 | Woolaway et al. | 250/208.1 |
| 5,698,892 A | 12/1997 | Koizumi et al. | 257/620 |
| 5,736,886 A * | 4/1998 | Mangelsdorf et al. | 327/310 |
| 6,188,094 B1 | 2/2001 | Kochi et al. | 257/232 |
| 6,307,195 B1 | 10/2001 | Guidash | 250/208.1 |
| 6,605,850 B1 | 8/2003 | Kochi et al. | 257/431 |
| 6,657,665 B1 * | 12/2003 | Guidash | 348/308 |
| 6,670,990 B1 | 12/2003 | Kochi et al. | 348/310 |
| 6,946,637 B2 | 9/2005 | Kochi et al. | 250/208.1 |
| 6,960,751 B2 | 11/2005 | Hiyama et al. | 250/208.1 |
| 6,974,975 B2 | 12/2005 | Shizukuishi | 257/98 |
| 7,016,089 B2 | 3/2006 | Yoneda et al. | 358/482 |
| 7,110,030 B1 | 9/2006 | Kochi et al. | 348/308 |
| 7,126,102 B2 | 10/2006 | Inoue et al. | 250/214 |
| 7,187,052 B2 | 3/2007 | Okita et al. | 257/444 |
| 2002/0027189 A1 | 3/2002 | Murakami et al. | 250/208.1 |
| 2003/0164887 A1 | 9/2003 | Koizumi et al. | 348/308 |
| 2004/0119864 A1 | 6/2004 | Kikuchi | 348/308 |
| 2005/0122418 A1 | 6/2005 | Okita et al. | 348/340 |
| 2005/0168618 A1 | 8/2005 | Okita et al. | 348/335 |
| 2005/0174552 A1 | 8/2005 | Takada et al. | 355/53 |
| 2005/0179796 A1 | 8/2005 | Okita et al. | 348/308 |
| 2005/0185074 A1 | 8/2005 | Yoneda et al. | 348/294 |
| 2005/0268960 A1 | 12/2005 | Hiyama et al. | 136/244 |
| 2005/0269604 A1 | 12/2005 | Koizumi et al. | 257/291 |
| 2006/0027843 A1 | 2/2006 | Ogura et al. | 257/291 |
| 2006/0043261 A1 | 3/2006 | Matsuda et al. | 250/208.1 |
| 2006/0043393 A1 | 3/2006 | Okita et al. | 257/93 |
| 2006/0043439 A1 | 3/2006 | Koizumi | 257/291 |
| 2006/0043440 A1 | 3/2006 | Hiyama et al. | 257/291 |
| 2006/0044434 A1 | 3/2006 | Okita et al. | 348/294 |
| 2006/0044439 A1 | 3/2006 | Hiyama et al. | 348/308 |
| 2006/0157759 A1 | 7/2006 | Okita et al. | 257/292 |
| 2006/0158539 A1 | 7/2006 | Koizumi et al. | 348/300 |
| 2006/0158543 A1 | 7/2006 | Ueno et al. | 348/308 |
| 2006/0164531 A1 * | 7/2006 | Yaung et al. | 348/308 |
| 2006/0208161 A1 | 9/2006 | Okita et al. | 250/208.1 |
| 2006/0208291 A1 | 9/2006 | Koizumi et al. | 257/292 |
| 2006/0208292 A1 | 9/2006 | Itano et al. | 257/292 |
| 2006/0221667 A1 | 10/2006 | Ogura et al. | 365/149 |
| 2007/0013796 A1 * | 1/2007 | Ueno et al. | 348/272 |
| 2007/0018080 A1 | 1/2007 | Inoue et al. | 250/214 |
| 2007/0085110 A1 | 4/2007 | Okita et al. | 257/239 |
| 2007/0126886 A1 | 6/2007 | Sakurai et al. | 348/222.1 |
| 2007/0205439 A1 | 9/2007 | Okita et al. | 257/228 |

FOREIGN PATENT DOCUMENTS

| | | |
|---|---|---|
| JP | 2004-335802 | 11/2004 |
| JP | 2006-217410 A | 8/2006 |

OTHER PUBLICATIONS

Sugawa, S. et al., "A 100dB Dynamic Range CMOS Image Sensor Using a Lateral Overflow Integration Capacitor", 2005 IEEE International Solid-State Circuits Conference, pp. 352,353 and 603 (Feb. 8, 2005).

* cited by examiner

SOLID STATE IMAGE PICKUP DEVICE WITH FIRST AND SECOND PHOTOELECTRIC CONVERSION REGIONS AND CARRIER ACCUMULATING UNITS CONNECTED IN PARALLEL TO EACH INPUT PORTION OF PLURAL AMPLIFYING UNITS

CROSS REFERENCE TO RELATED APPLICATION

This application is a continuation of U.S. application Ser. No. 11/373,195, filed Mar. 13, 2006, the entire disclosure of which is hereby incorporated by reference herein.

BACKGROUND OF THE INVENTION

1. Field of the Invention

The present invention generally relates to a solid state image pickup device and a camera, and more particularly to a solid state image pickup device the dynamic range of which is expanded.

2. Description of Related Art

Figure 7:
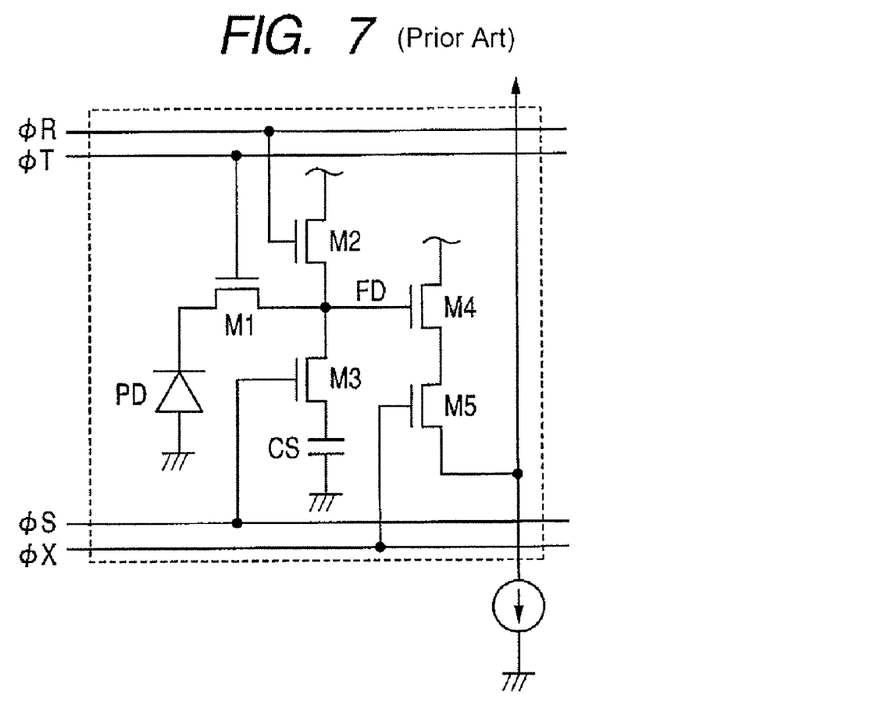
FIG. 7 is a circuit diagram of a solid state image pickup device.
Figure 8:
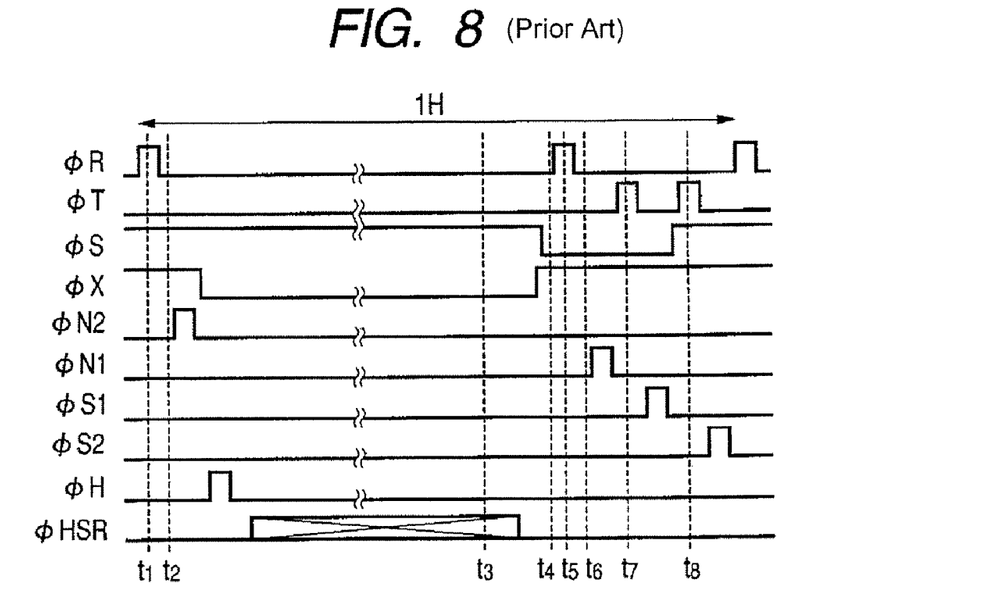
FIG. 8 is a timing chart showing the operation of the solid state image pickup device of FIG. 7.

FIG. 7 is a circuit diagram of a solid state image pickup device disclosed in Non-Patent Document 1 (Shigetoshi Sugawa et al. (five persons), "A 100 dB Dynamic Range CMOS Image Sensor Using a Lateral Overflow Integration Capacitor", ISSCC 2005/SESSION 19/IMAGERS/19.4, DIGEST OF TECHNICAL PAPERS, 2005 IEEE International Solid-State Circuit Conference, Feb. 8, 2005, pp. 352-353, 603.) FIG. 8 is a timing chart showing the operation of the solid state image pickup device. Hereinafter, an n-channel MOS field effect transistor is simply referred to as a transistor. FIGS. 9A, 9B, 9C, 9D, 9E and 9F are conceptual diagrams for illustrating the potential in a series of operations of the solid state image pickup device and the flows of carriers.

Figures 9A, 9B:
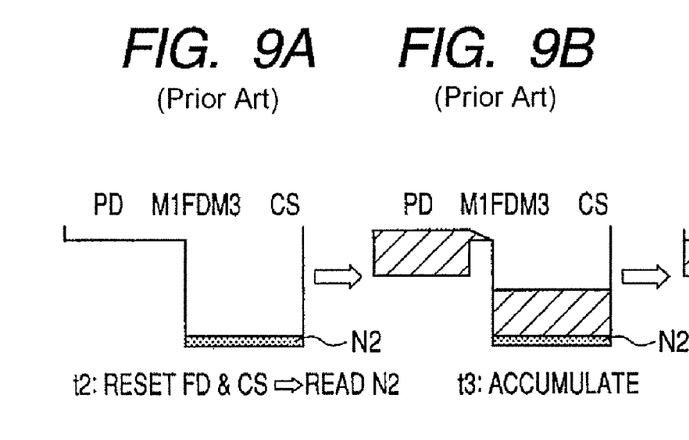
FIGS. 9A, 9B, 9C, 9D, 9E and 9F are figures for illustrating the operation of the solid state image pickup device shown in FIG. 8.

First, as shown in FIG. 9A, at timing t2, a transistor M3 is turned on, and noises N2 after a reset are accumulated in a floating diffusion FD and an additional capacity CS. Then, the noises N2 are read.

Next, as shown in FIG. 9B, at timing t3, light is radiated onto a photodiode PD, and carriers are accumulated in the photodiode PD. After the accumulated carriers of the photodiode PD have filled the photodiode PD, the carriers overflowed from the photodiode PD flow into the floating diffusion FD and the additional capacity CS.

Figure 9C:
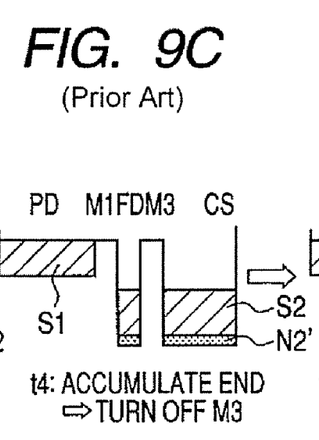

Next, as shown in FIG. 9C, after the carrier accumulation ends, at timing t4, the transistor M3 is turned off, and the carriers are distributed to the floating diffusion FD and the additional capacity CS at a predetermined rate. A pixel signal S2 and noises N2' are accumulated in the additional capacity CS. A pixel signal S1 is accumulated in the photodiode PD.

Figure 9D:
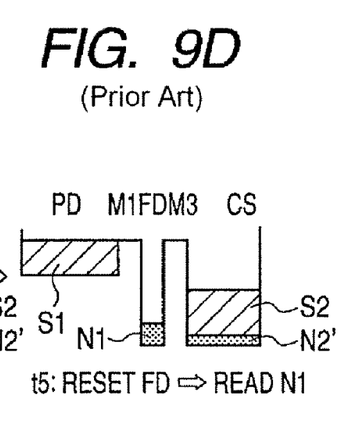

Next, as shown in FIG. 9D, the floating diffusion FD is reset at timing t5. Only noises N1 remain in the floating diffusion FD. After that, the noises N1 are read from the floating diffusion FD.

Figure 9E:
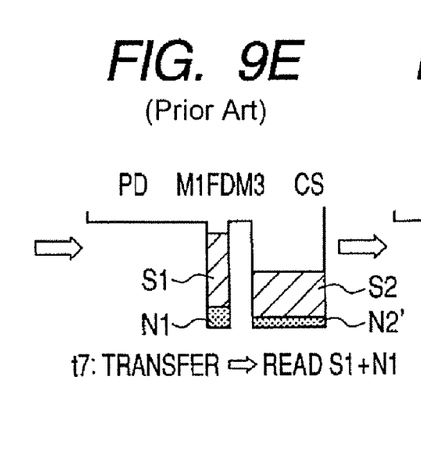

Next, in FIG. 9E, a transistor M1 is turned on, and the carriers of the pixel signal S1 in the photodiode PD are transferred to the floating diffusion FD. In the floating diffusion FD, the noises N1 and the pixel signal S1 are accumulated.

Figure 9F:
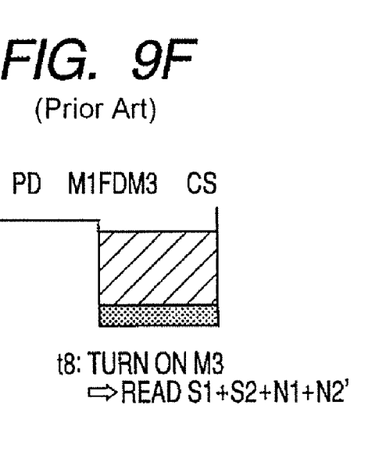

Next, in FIG. 9F, the transistor M3 is turned on. The carriers of the pixel signals S1 and S2, and the noises N1 and N2' are accumulated in the floating diffusion FD and the additional capacity CS, and the carriers are read.

Moreover, Japanese Patent Application Laid-Open No. 2001-186414 (corresponding to U.S. Pat. No. 6,307,195) and Japanese Patent Application Laid-Open No. 2004-335802 disclose solid state image pickup devices for expanding dynamic ranges.

The circuit shown in FIG. 7 is a circuit for one pixel, and it is difficult to use the transistors M2, M4 and M5 commonly to a plurality of pixels in order to decrease the number of the transistors. In the circuit of FIG. 7, the carriers overflowed from the photodiode PD flow into the additional capacity CS through the floating diffusion FD. Consequently, if it is tried to share the transistors M2, M4 and M5, the floating diffusion FD of a plurality of pixels is mutually connected, and the pixel signal of the plurality of pixels is mixed with each other. Hence, it becomes impossible to read the signal of each pixel. Consequently, it is impossible to share the transistors M2, M4 and M5 to decrease the number of the transistors.

Moreover, because the carriers overflowed from the photodiode PD flow into the additional capacity CS through the floating diffusion FD, noises are easily generated due to the influence of the defects (damages) of the floating diffusion FD. The floating diffusion FD has many defects as compared with the photodiode PD. Consequently, in the floating diffusion FD, the accumulated carriers disappear owing to the defects, and great fixed pattern noises occur.

It is an object of the present invention to provide a solid state image pickup device and a camera that can decrease the number of circuit elements and generate pixel signals with fewer noises.

SUMMARY OF THE INVENTION

A solid state image pickup device of the present invention includes a plurality of photoelectric conversion regions for generating carriers by photoelectric conversions and accumulating the generated carriers; an amplifying unit for amplifying the carriers, the amplifying unit being commonly provided for at least two of the photoelectric conversion regions; a first transfer unit for transferring the carriers accumulated in the first photoelectric conversion region to the amplifying unit; a first carrier accumulating unit for accumulating carriers flowing out from the first photoelectric conversion region through a first fixed potential barrier; a second transfer unit for transferring the carriers accumulated in the first carrier accumulating unit to the amplifying unit; a third transfer unit for transferring the carriers accumulated in the second photoelectric conversion region to the amplifying unit; a second carrier accumulating unit for accumulating the carriers flowing out from the second photoelectric conversion region through a second fixed potential barrier; and a fourth transfer unit for transferring the carriers accumulated in the second carrier accumulating unit to the amplifying unit.

Other features and advantages of the present invention will be apparent from the following description taken in conjunction with the accompanying drawings, in which like reference characters designate the same or similar parts throughout the figures thereof.

The accompanying drawings, which are incorporated in and constitute a part of the specification, illustrate embodiments of the invention and together with the description, serve to explain the principles of the invention.

DETAILED DESCRIPTION OF THE PREFERRED EMBODIMENTS

First Embodiment

Figure 1:
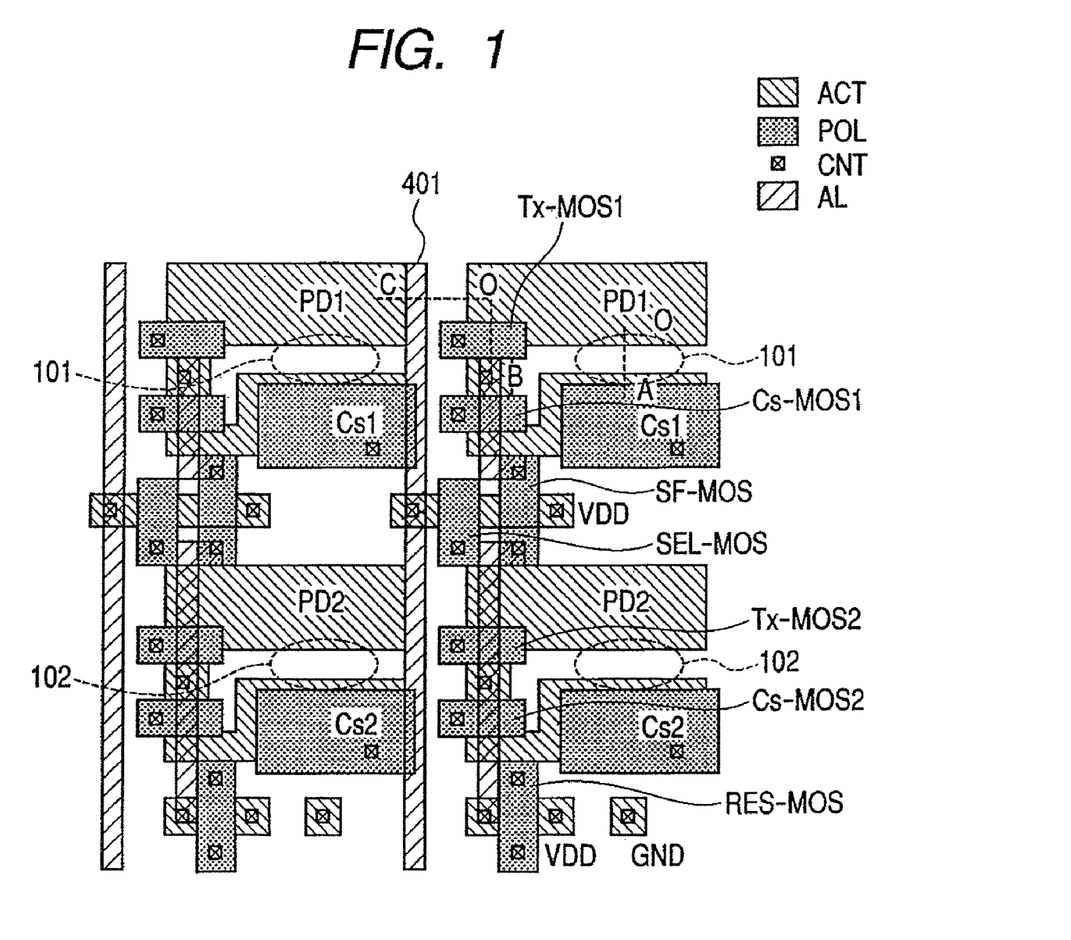
FIG. 1 is a layout chart showing an example of the whole configuration of a solid state image pickup device according to a first embodiment of the present invention.
Figure 2:
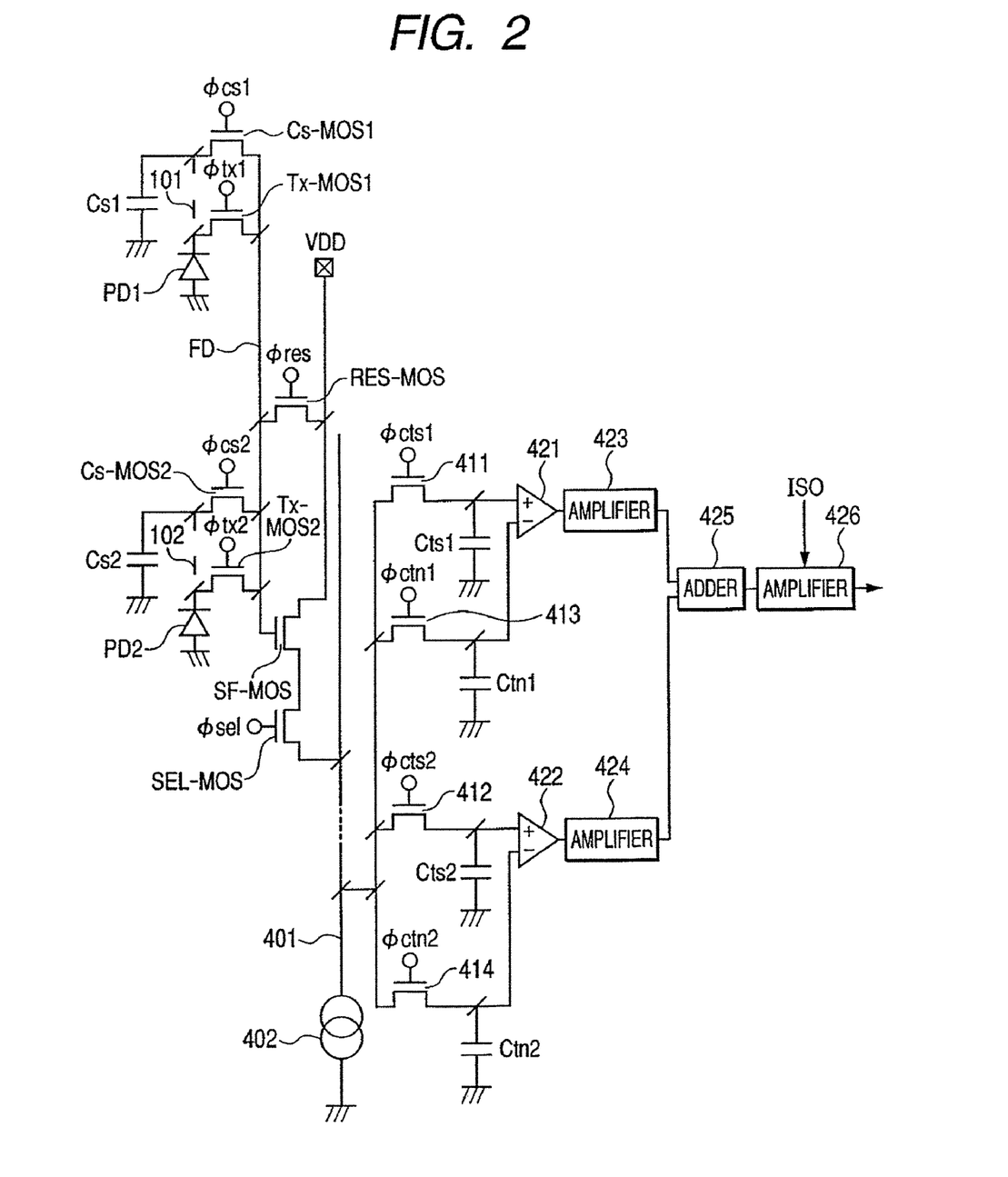
FIG. 2 is an equivalent circuit diagram of the solid state image pickup device of FIG. 1.

FIG. 1 is a layout chart showing an example of the whole configuration of a solid state image pickup device according to a first embodiment of the present invention, and FIG. 2 is an equivalent circuit diagram of the solid state image pickup device of FIG. 1.

In FIG. 1, the hatches drawn in the regions of photodiodes PD1 and PD2, and the like denote semiconductor regions (active regions) ACT. The hatches drawn in the regions of additional capacities Cs1 and Cs2, and the like denote polysilicon POL. The hatches drawn in the regions in wiring 401 and the like denote aluminum wiring AL. The hatches drawn in the regions in the portions connecting the wiring 401 with the semiconductor regions ACT and the like denote contact portions CNT.

The configuration of FIG. 2 is described. First, a first pixel structure is described. A photodiode (a first photoelectric conversion region) PD1 generates carriers by photoelectric conversions, and accumulates the generated carriers. A transfer transistor (a first transfer unit) Tx-MOS1 is a transfer gate for transferring the carriers accumulated in the photodiode PD1 to a source follower transistor SF-MOS. The additional capacity (a first carrier accumulating unit) Cs1 is a carrier accumulating unit for accumulating the carriers overflowing the photodiode PD1 through a first fixed potential barrier 101. A transfer transistor (a second transfer unit) Cs-MOS1 is a transfer gate for transferring the carriers accumulated in the additional capacitor Cs1 to the source follower transistor SF-MOS. The transistor Tx-MOS1 includes a gate connected to potential φtx1, a source connected to the cathode of the photodiode PD1, and a drain connected to the gate of the transistor SF-MOS. The drain of the transistor Tx-MOS1 corresponds to the floating diffusion FD, and can accumulate carriers. The anode of the photodiode PD1 is connected to the ground GND. The transistor Cs-MOS1 has a gate controlled by φcs1, a source connected to the electrode of one end of the additional capacitor Cs1, and a drain connected to the gate of the transistor SF-MOS. The electrode on the other end of the additional capacitor Cs1 is connected to the ground GND.

Next, a second pixel structure is described. A photodiode (a second photoelectric conversion region) PD2 generates carriers by photoelectric conversions, and accumulates the generated carriers. A transfer transistor (a third transfer unit) Tx-MOS2 is a transfer gate for transferring the carriers accumulated in the photodiode PD2 to a source follower transistor SF-MOS. The additional capacitor (a second carrier accumulating unit) Cs2 is a carrier accumulating unit for accumulating the carriers overflowing the photodiode PD2 through a second fixed potential barrier 102. A transfer transistor (a fourth transfer unit) Cs-MOS2 is a transfer gate for transferring the carrier accumulated in the additional capacitor Cs2 to the source follower transistor SF-MOS. The transistor Tx-MOS2 includes a gate controlled by φtx2, a source connected to the cathode of the photodiode PD2, and a drain connected to the gate of the transistor SF-MOS. The drain of the transistor Tx-MOS2 corresponds to the floating diffusion FD, and can accumulate carriers. The anode of the photodiode PD2 is connected to the ground GND. The transistor Cs-MOS2 has a gate controlled by φcs2, a source connected to the electrode on one end of the additional capacitor Cs2, and a drain connected to the gate of the transistor SF-MOS. The electrode on the other end of the additional capacitor Cs2 is connected to the ground GND. A pixel unit is composed of the photoelectric conversion regions, each transferring transistor and each carrier accumulating unit in the first and the second pixel structures. A plurality of pixel units like this is arranged.

The floating diffusions FD of the transistors Tx-MOS1 and Tx-MOS2 are mutually connected with wiring. In the source follower transistor (amplifying unit) SF-MOS, the drain thereof is connected to the power supply potential VDD, and the source thereof is connected to the drain of the transistor SEL-MOS to output the carriers supplied to the gate after amplifying the carriers. The gate of the selection transistor SEL-MOS is controlled by φsel, and the source of the transistor SEL-MOS is connected with the signal wiring 401. In a reset transistor (reset unit) RES-MOS, the gate thereof is controlled by φres; the source thereof is connected with the floating diffusion FD; and the drain thereof is connected to the power supply potential VDD. A current source 402 is connected between the signal wiring 401 and the ground GND.

In the solid state image pickup device, a plurality of pixels is two-dimensionally arranged. In FIG. 2, only two pixels of the first and the second pixels are shown as an example. The additional capacities Cs1 and Cs2 adjoin the photodiodes PD1 and PD2, respectively. The first pixel (composed of the photodiode PD1 and the additional capacitor Cs1) shows, for example, a pixel in an odd line. The second pixel (composed of the photodiode PD2 and the additional capacitor Cs2) shows, for example, a pixel of an even line. That is, the first pixel and the second pixel are arranged in every two lines in order. Because the transistors SF-MOS, SEL-MOS and RES-MOS are commonly used for two pixels, the number of elements to be used can be reduced, and the aperture ratio of the photoelectric conversion region can be improved. The present embodiment two-dimensionally arranges many pixels in the way of using two pixels as one unit.

Figure 3:
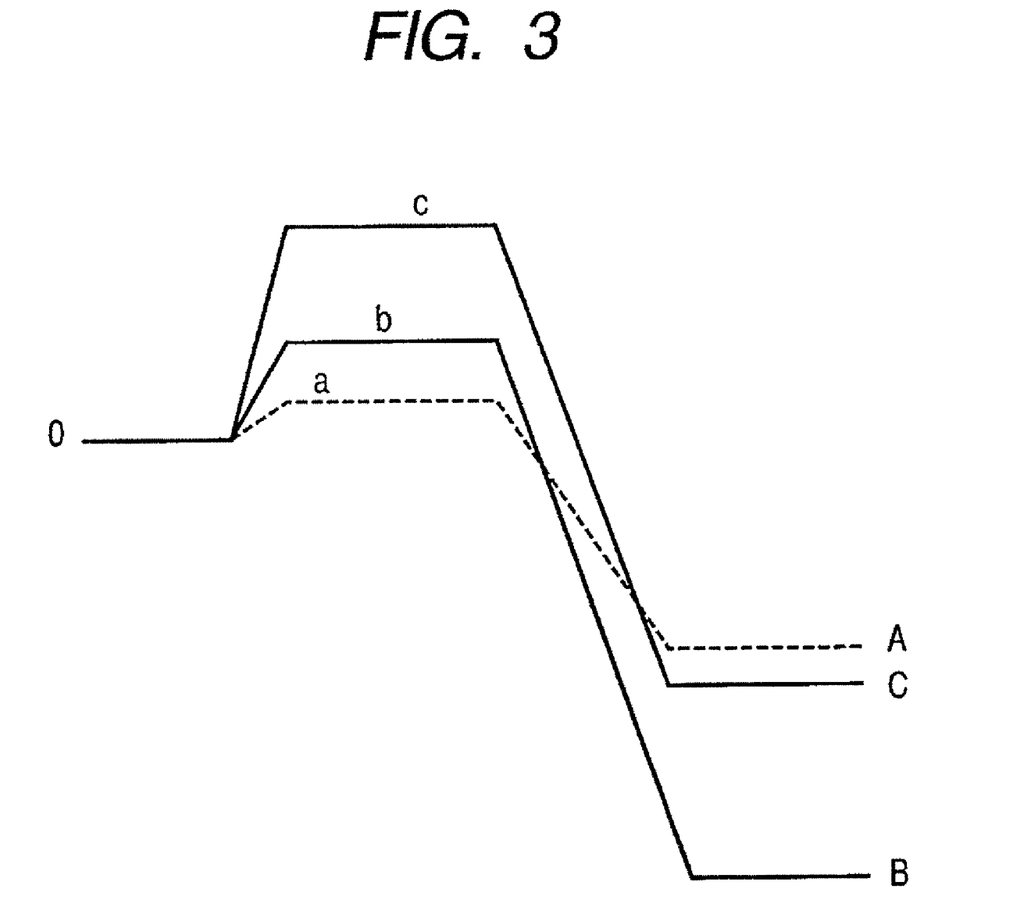
FIG. 3 is a potential diagram of the cross sections along lines O-A, O-B and O-C in FIG. 1 during a carrier accumulating period.
Figure 4:
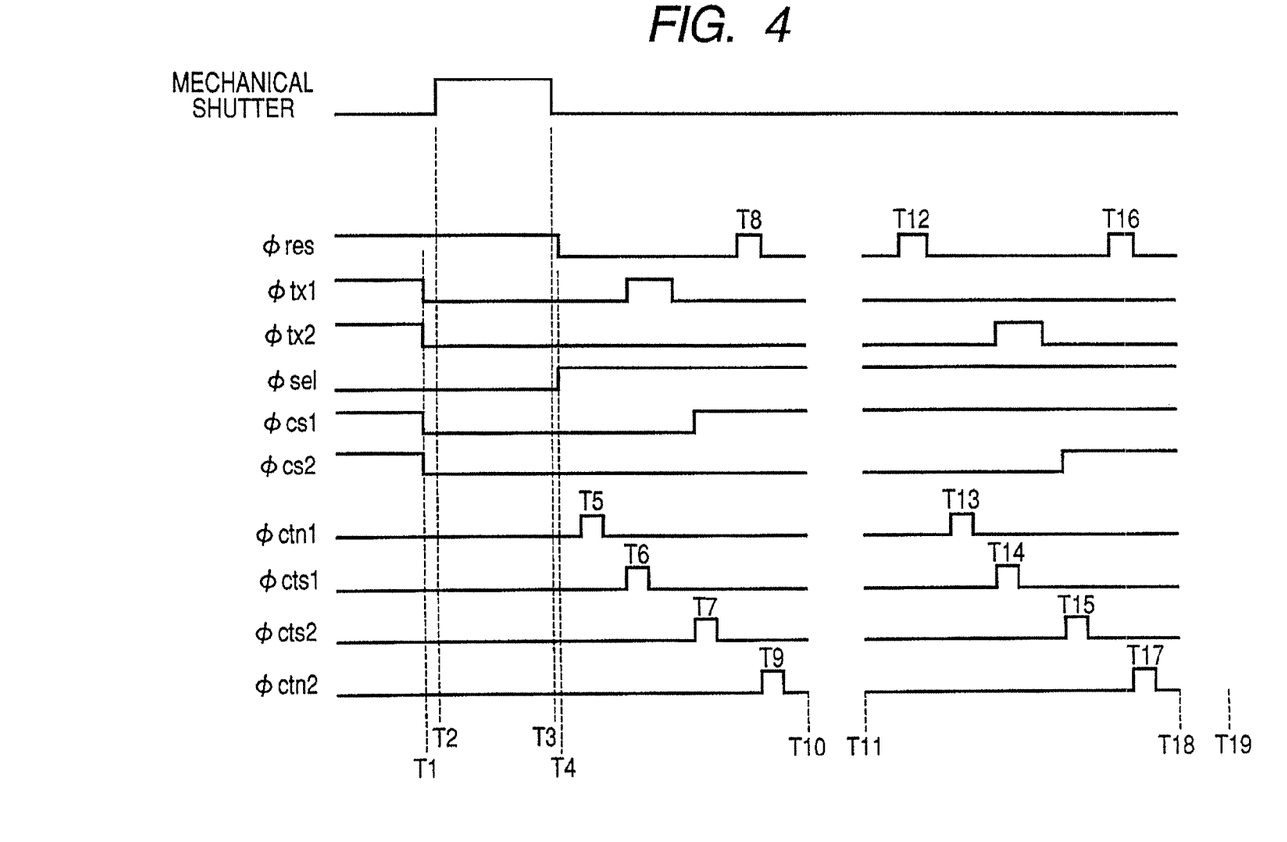
FIG. 4 is a timing chart showing an example of the operation of the circuit shown in FIG. 2.

FIG. 3 is a potential diagram of cross sections along lines O-A, O-B and O-C in FIG. 1 during the carrier accumulation period (timing T2-T3 of FIG. 4).

The potential barrier a shown by the O-A line indicates the heights of the fixed potential barriers in the fixed potential barrier regions 101 and 102. The region 101 is a region between the photodiode PD1 and the additional capacitor Cs1. The region 102 is a region between the photodiode PD2 and the additional capacitor Cs2. The regions 101 and 102 are formed as the regions in which semiconductor impurity concentration differences differ to the surroundings. A point O shows the heights of the potential barriers of the photodiodes PD1 and PD2. A point A shows the heights of the potential barriers of the additional capacities Cs1 and Cs2.

The potential barrier b shown by the O-B line indicates the heights of the potential barriers under the transfer gates between the photodiodes PD1 and PD2 and the floating diffusions FD. That is, the potential barrier b indicates the heights of the potential barriers of the channel regions of the transfer transistors Tx-MOS1 and Tx-MOS2. A point B indicates the heights of the potential barriers in the floating diffusions FD.

The potential barrier c shown by the O-C line indicates the height of the element separation barrier between the photodiode PD1 or PD2 in a certain pixel and another pixel adjoining the former pixel. The region forming the potential barrier c of this portion needs a higher potential barrier as compared with the potential barriers a and b. The leaking of the carriers into the adjoining pixel region can be suppressed by forming the higher potential barrier.

The potential barrier c is higher than the potential barriers a and b. The potential barrier a is lower than the potential barrier b. Thereby, when the accumulated carriers of the photodiodes PD1 and PD2 have filled the photodiodes PD1 and PD2, the overflowing carriers flow into the additional capacities Cs1 and Cs2 not through the potential barrier b of the transfer transistors Tx-MOS1 and Tx-MOS2 but through the potential barrier a of the regions 101 and 102 where the potential barrier is the lowest.

The photodiodes PD1 and PD2 are n type regions. Each of the element separation regions of the potential barrier c, the regions of the potential barrier b, and the regions 101 and 102 of the potential barrier a is a p type region, and the effective career concentration in an accumulation period is preferably to be a<b<c. The heights of the potential barriers a, b and c are controlled by the adjustment of the semiconductor impurity concentrations and by the potential during the accumulation periods of the gate voltages φtx1 and φtx2 controlling the potential barrier b.

By making the potential barriers be in the relation of a<b<c, a still further advantage is produced. That is, when stronger light exceeding the strong light making the photodiodes PD1 and PD2 overflow and making the overflowed carriers flow into the additional capacities Cs1 and Cs2 is radiated, or when the strong light is radiated for a long time to be accumulated, the case where carriers flow into the additional capacities Cs1 and Cs2 to overflow the additional capacities Cs1 and Cs2 is assumable. In this case, in the relation of a<b=c, or a<c<b, the carriers flow into the adjoining pixel to cause color mixing, and the image quality is remarkably deteriorated. Accordingly, when the potential barriers are formed so as to be in the relation of a<b<c, the carriers that have overflowed the additional capacities Cs1 and Cs2 flow out to the floating diffusions FD reset near to the voltage VDD during the accumulation period, and the excessive carriers can be rapidly thrown away. Consequently, no color mixing is generated, and an image having a high image quality can be obtained.

The amounts of the carriers that the photodiodes PD1 and PD2 can accumulate are determined. Consequently, when strong light is radiated onto the photodiodes PD1 and PD2, carriers overflow the photodiodes PD1 and PD2. The carriers that have overflowed the photodiodes PD1 and PD2 flow into the additional capacities Cs1 and Cs2.

The carriers that have overflowed the photodiodes PD1 and PD2 severally flow into the additional capacities Cs1 and Cs2 through the lowest potential barrier a. It is necessary to prevent the carriers from flowing into the floating diffusions FD through the transfer transistors Tx-MOS1 and Tx-MOS2 during the carrier accumulation period. The reason is that, because the floating diffusions FD are in the reset state, the carriers that have flowed into the floating diffusions FD through the transfer transistors Tx-MOS1 and Tx-MOS2 are rapidly thrown away by the reset.

The feature of the present embodiment mentioned above differs from that of the solid state image pickup device shown in FIGS. 7 and 8. In the solid state image pickup device shown in FIGS. 7 and 8, the carriers that have overflowed from the photodiode PD are accumulated in the floating diffusion FD and the additional capacitor CS through the transfer transistor M1. Consequently, in the floating diffusion FD, in which many defects exist as compared with the photodiode PD, the accumulated carriers disappear owing to the defects, and great fixed pattern noises are generated.

On the other hand, in the present embodiment, the carriers can be made to flow into the additional capacities Cs1 and Cs2 directly from the photodiodes PD1 and PD2 without passing the transfer transistors Tx-MOS1 and Tx-MOS2 and the floating diffusions FD, respectively. Consequently, no disappearance of the carriers caused by the defects of the floating diffusions FD is generated during the carrier accumulating period, and the solid state image pickup device with less fixed pattern noises can be obtained.

FIG. 4 is a timing chart showing an example of the operation of the circuit shown in FIG. 2. The high level of the row labeled as MECHANICAL SHUTTER denotes the opened state of a mechanical shutter 53 (see FIG. 5), and the lower level of the row denotes the closed state of the mechanical shutter 53. The mark φres denotes the potential for controlling the gate of the reset transistor RES-MOS; the mark φtx1 denotes the potential for controlling the gate of the transfer transistor Tx-MOS1; and the mark φtx2 denotes the potential for controlling the gate of the transfer transistor Tx-MOS2. A mark φsel denotes the potential for controlling the gate of the selection transistor SEL-MOS. A mark φcs1 denotes the potential for controlling the gate of the transfer transistor Cs-MOS1. A mark φcs2 denotes the potential for controlling the gate of the transfer transistor Cs-MOS2. A mark φCtn1 denotes the potential for controlling the gate of a transistor 413. A mark φCts1 denotes the potential for controlling the gate of a transistor 411. A mark φCts2 denotes the potential for controlling the gate of a transistor 412. A mark φCtn2 denotes the potential for controlling the gate of a transistor 414.

Before timing T1, the mechanical shutter 53 is closed. Each φres, φtx1, φtx2, φcs1 and φcs2 takes a high level, and each φsel, φctn1, φcts1, φcts2 and φctn2 takes a low level. The reset transistor RES-MOS, the transfer transistors Tx-MOS1, Tx-MOS2, Cs-MOS1 and Cs-MOS2 are turned on. Thereby, the power supply potential VDD is supplied to the floating diffusions FD, the photodiodes PD1 and PD2, and the additional capacities Cs1 and Cs2, and their accumulated carriers are reset to the power supply potential VDD.

Next, at the timing T1, φtx1, φtx2, φcs1 and φcs2 is made to be the low level. Then, the transfer transistors Tx-MOS1, Tx-MOS2, Cs-MOS1 and Cs-MOS2 are turned off, and the photodiodes PD1 and PD2 and the additional capacities Cs1 and Cs2 are made to be possible to accumulate carriers.

Next, at timing T2, the mechanical shutter 53 is opened. Light is radiated onto the photodiodes PD1 and PD2, and the photodiodes PD1 and PD2 start to generate and accumulate negative carriers. When strong light is radiated on the photodiodes PD1 and PD2, the photodiodes PD1 and PD2 are saturated, and the negative carriers flow from the photodiodes PD1 and PD2 into the additional capacities Cs1 and Cs2. The additional capacities Cs1 and Cs2 accumulate the overflowed carriers. The carriers that have overflowed before the saturation of the photodiodes may be accumulated.

Next, at timing T3, the mechanical shutter 53 is closed. The photodiodes PD1 and PD2 are shielded from light, and the generation of the carriers by the photodiodes PD1 and PD2 ends. Consequently, the carrier accumulating period is a period from the timing T2 to the timing T3.

Next, at timing T4, φres is made to be the low level, and φsel is made to be the high level. The reset transistor RES-MOS is turned off, and the selection transistor SEL-MOS is turned on to make the signal wiring 401 an active state. The source follower transistor SF-MOS constitutes a source follower amplifier, and outputs an output voltage to the signal wiring 401 according to the potential of the floating diffusions FD. At this time, the noise carriers after the reset are accumulated in the floating diffusions FD.

Next, at timing T5, a positive pulse is applied as φctn1. The transistor 413 is turned on, and the potential of the signal wiring 401 according to the floating diffusions FD is accumulated in a capacity Ctn1. The potential corresponds to the noise carriers of the floating diffusions FD.

Next, at timing T6, φtx1 is made to be the high level, and a positive pulse is applied as φcts1. The transfer transistor Tx-MOS1 is turned on, and the accumulated carriers of the photodiode PD1 are transferred to the floating diffusions FD. The source follower transistor SF-MOS outputs an output voltage to the signal wiring 401 according to the potential of the floating diffusions FD. The pixel signal carriers of the photodiode PD1 are accumulated in the floating diffusions FD. After that, the transistor 411 is turned on, and the potential of the signal wiring 401 according to the potential of the floating diffusions FD is accumulated in a capacity Cts1. The potential corresponds to the pixel signal carriers of the photodiode PD1. After that, φtx1 is returned to the low level.

Next, at timing T7, the potential φcs1 is made to be the high level, and a positive pulse is applied as φcts2. The transfer transistor Cs-MOS1 is turned on, and the accumulated carriers in the additional capacitor Cs1 are transferred to the floating diffusions FD. The source follower transistor SF-MOS outputs an output voltage to the signal wiring 401 according to the potential of the floating diffusions FD. The pixel signal carriers of the additional capacitor Cs1 are accumulated in the floating diffusions FD. The transistor 412 is turned on, and the potential of the signal wiring 401 according to the potential of the floating diffusions FD is accumulated in a capacity Cts2. The potential corresponds to the pixel signal carriers of the additional capacitor Cs1.

Next, at timing T8, a positive pulse is applied as φres. The reset transistor RES-MOS is turned on, and the floating diffusions FD and the additional capacitor Cs1 are reset to the power supply potential VDD. The noises after the reset of the floating diffusions FD and the additional capacitor Cs1 are accumulated in the floating diffusions FD. The source follower transistor SF-MOS outputs an output voltage to the signal wiring 401 according to the potential of the floating diffusions FD. The noise carriers of the floating diffusions FD and the additional capacitor Cs1 are accumulated in the floating diffusions FD.

Next, at timing T9, a positive pulse is applied as φctn2. The transistor 414 is turned on, and the potential of the signal wiring 401 according to the potential of the floating diffusions FD is accumulated in a capacity Ctn2. The potential corresponds to the noise carriers of the floating diffusions FD and the additional capacitor Cs1.

By the processing described above, the pixel signal of the photodiode PD1 is accumulated in the capacity Cts1, and the noises of the floating diffusions FD are accumulated in the capacity Ctn1. The pixel signal of the additional capacitor Cs1 is accumulated in the capacity Cts2, and the noises of the floating diffusions FD and the additional capacitor Cs1 are accumulated in the capacity Ctn2.

Moreover, in the drives of the transistors Cs-MOS1 and Cs-MOS2 by φCs1 and φCs2, respectively, in the present embodiment, the transistors Cs-MOS1 and Cs-MOS2 may be opened only once by φCs1 and φCs2, respectively, during a horizontal blanking period (e.g. the period of timing T11-T18 in FIG. 4) after all of the additional capacities Cs1 and Cs2 are simultaneously closed at the timing T1 for starting the accumulation of the additional capacities Cs1 and Cs2.

On the other hand, in the prior art disclosed in FIG. 8, φS is required to perform the operations of closing the additional capacitor Cs once during a horizontal blanking period with the transistor M3, and of opening the additional capacitor Cs again. The reason of the necessity is that the transistor M3 must be opened during the accumulation period because the carriers in FIG. 7 pass the floating diffusion FD. Accordingly, for reading the carriers of the photodiode PD in advance, the operation of closing the transistor M3 becomes indispensable. On the other hand, in the present embodiment, the carriers accumulated in the additional capacities Cs1 and Cs2 directly flow from the photodiodes PD1 and PD2 into the additional capacities Cs1 and Cs2.

When the opening and closing operations of this kind are frequently performed, there is also caused a problem in which the horizontal blanking time becomes longer and the number of images that can be read for a certain period decreases. In the present embodiment, as described above, because the operations of the transistors Cs-MOS1 and Cs-MOS2 by φfcs1 and φfcs2 do not need much times, the horizontal blanking time can be shortened, and more images can be read for a certain time.

Next, in FIG. 2, the operation of a pixel signal generating unit is described. A differential amplifier 421 outputs a voltage having the amplitude obtained by subtracting a nose voltage of the capacity Ctn1 from the pixel signal voltage of the capacity Cts1. A differential amplifier 422 outputs a voltage having the amplitude obtained by subtracting the noise voltage of the capacity Ctn2 from the pixel signal voltage of the capacity Cts2. An amplifier 423 amplifies the output signal of the differential amplifier 421. An amplifier 424 amplifies the output signal of the differential amplifier 422.

An adder 425 adds the output signals of the amplifiers 423 and 424 with each other to output a pixel signal. Because the pixel signal is generated based on the accumulated carriers of the photodiode PD1 and the carriers that have overflowed into the additional capacitor Cs1, the dynamic range of a pixel signal can be expanded more than that in the case of using only the accumulated carriers in the photodiode PD.

An amplifier 426 amplifies the output signal of the adder 425 according to the ISO sensitivity, and outputs the amplified signal. When the value of the ISO sensitivity is small, the amplification degree of the amplifier 426 is small. When the value of the ISO sensitivity is large, the amplification degree is large.

In FIG. 4, the timing T4-T10 concerns a reading period of the first pixel (the photodiode PD1 and the additional capacitor Cs1). Timing T10-T11 concerns a period for transferring the signal of the first pixel in the horizontal direction.

Next, at timing T11-T18, the reading of the second pixel is performed like at the timing T4-T10 described above.

At the timing T12, a positive pulse is applied as φres. The reset transistor RES-MOS is turned on, and the floating diffusions FD are reset to the power supply potential VDD.

Next, at the timing T13, a positive pulse is applied as φctn1. The transistor 413 is turned on, and the potential of the signal wiring 401 according to the potential of the floating diffusions FD is accumulated in the capacity Ctn1. The potential corresponds to the noise carriers of the floating diffusions FD.

Next, at the timing T14, φtx2 is made to be the high level, and a positive pulse is applied as φcts1. The transfer transistor Tx-MOS2 is turned on, and the accumulated carriers in the photodiode PD2 are transferred to the floating diffusions FD. After that, the transistor 411 is tuned on, and the potential of the signal wiring 401 according to the potential of the floating diffusions FD is accumulated in the capacity Cts1. The potential corresponds to the pixel signal carriers of the photodiode PD2. After that, φtx2 is returned to the low level.

Next, at the timing T15, φcs2 is made to be the high level, and a positive pulse is applied as φcts2. The transfer transistor Cs-MOS2 is turned on, and the accumulated carriers of the additional capacitor Cs2 are transferred to the floating diffusions FD. After that, the transistor 412 is turned on, and the potential of the signal wiring 401 according to the potential of the floating diffusions FD is accumulated in the capacity Cts2. The potential corresponds to the pixel signal carriers of the additional capacitor Cs2.

Next, at the timing T16, a positive pulse is applied as φres. The reset transistor RES-MOS is turned on, and the floating diffusions FD and the additional capacitor Cs2 are reset to the power supply potential VDD. The noises after the reset of the floating diffusions FD and the additional capacitor Cs2 are accumulated in the floating diffusions FD.

Next, at the timing T17, a positive pulse is applied as φctn2. The transistor 414 is turned on, and the potential of the signal wiring 401 according to the potential of the floating diffusions FD is accumulated in the capacity Ctn2. The potential corresponds to the noise carriers of the floating diffusions FD and the additional capacitor Cs2.

By the processing mentioned above, the pixel signal of the photodiode PD2 is accumulated in the capacity Cts1, and the noises of the floating diffusions FD are accumulated in the capacity Ctn1. The pixel signal of the additional capacitor Cs2 is accumulated in the capacity Cts2, and the noises of the floating diffusions FD and the additional capacitor Cs2 are accumulated in the capacity Ctn2.

After that, like the above, the differential amplifiers 421 and 422, the amplifiers 423, 424 and 426, and the adder 425 operate to generate the signal of the second pixel. That is, the signal of the second pixel is generated based on the pixel signal accumulated in the photodiode PD2 and the additional capacitor Cs2. In FIG. 4, the timing T11-T18 is the reading period of the second pixel (composed of the photodiode PD2 and the additional capacitor Cs2). The timing T18-T19 is a period of transferring the signal of the second pixel in the horizontal direction.

Figure 10:
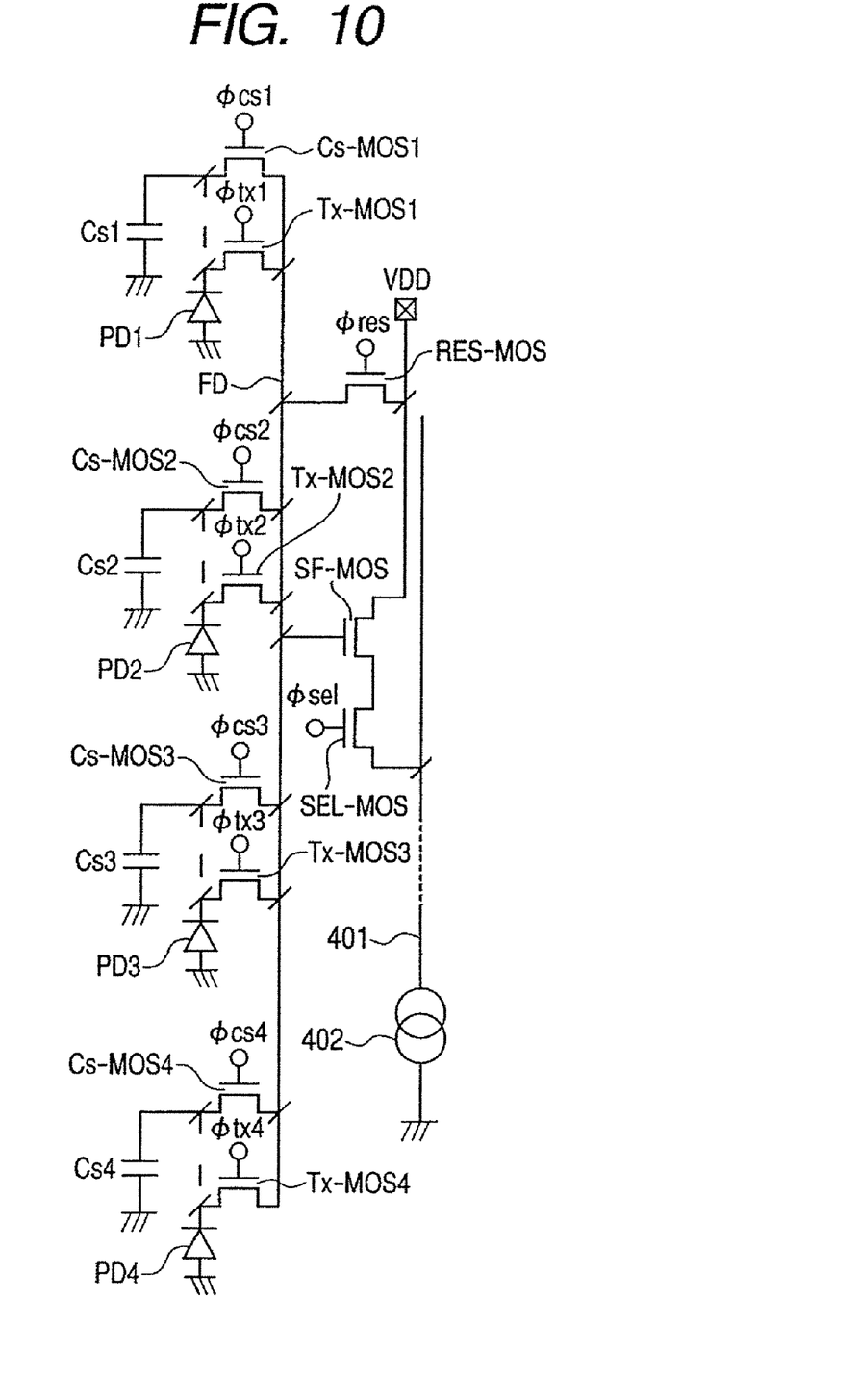
FIG. 10 is an equivalent circuit diagram showing a solid state image pickup device using one amplifying unit shared by four photodiodes.

Moreover, in the present embodiment, although the configuration in which the two photodiodes PD1 and PD2 are connected with one amplifying unit has been described, the configuration of the present invention is not restricted to the configuration mentioned above. For example, the configuration in which four photodiodes PD1-PD4 share one amplifying unit may be adopted, as shown in FIG. 10. The number of the photodiodes to be commonly used can be suitably set.

Second Embodiment

Figure 5:
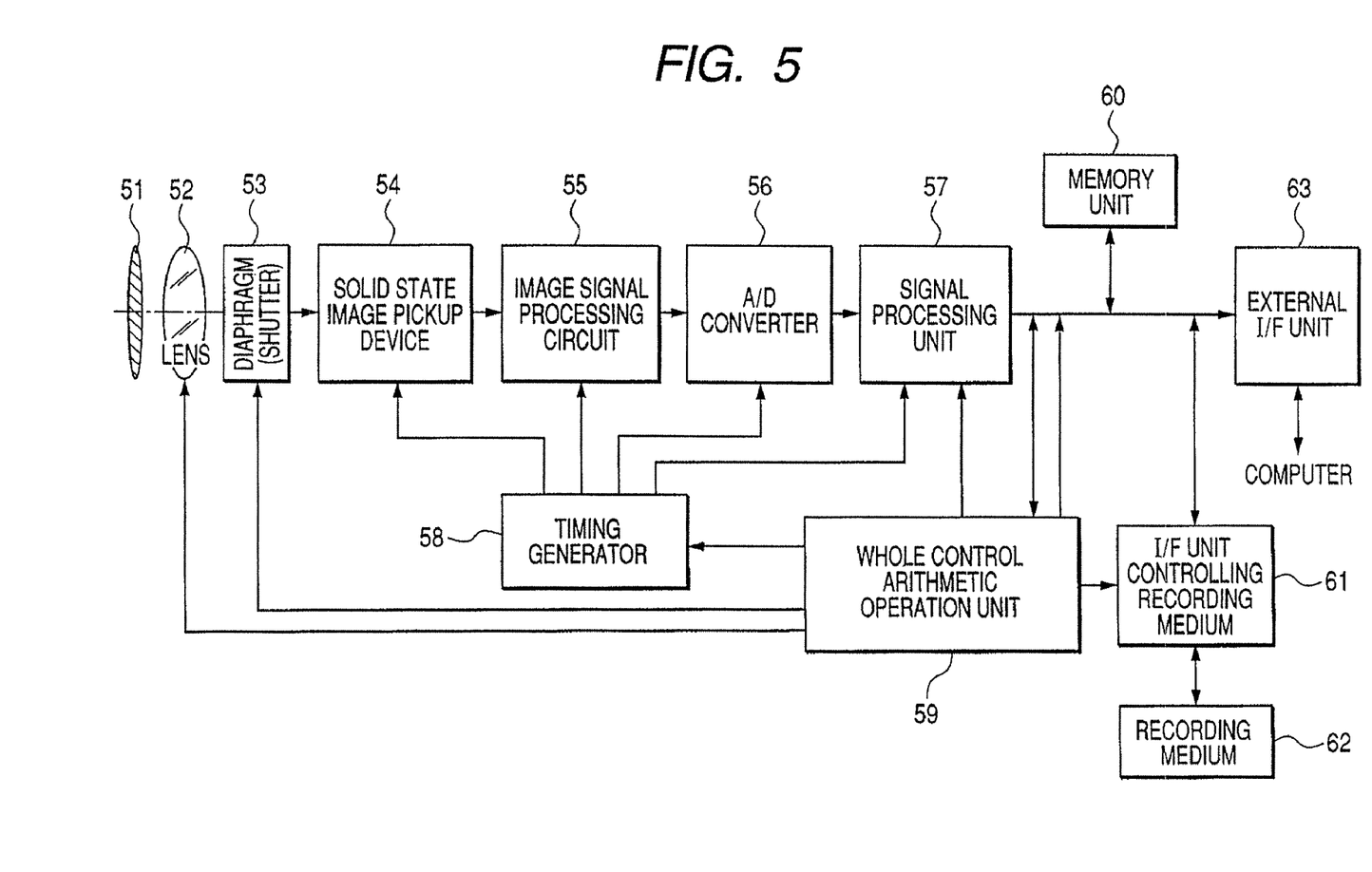
FIG. 5 is a block diagram showing a configuration example of a still video camera according to a second embodiment of the present invention.

FIG. 5 is a block diagram showing a configuration example of a still video camera according to a second embodiment of the present invention. Based on FIG. 5, an example of applying the solid state image pickup device of the first embodiment to a still video camera is described in detail. A solid state image pickup device 54 and an image signal processing circuit 55 correspond to the solid state image pickup device of the first embodiment.

A reference numeral 51 denotes a barrier to be commonly used as a protector of a lens and a main switch. A reference numeral 52 denotes a lens for forming an optical image of a subject on a solid state image pickup device 54. A reference numeral 53 denotes a diaphragm varying light quantity that has passed the lens 52 and a mechanical shutter. The reference numeral 54 denotes the solid state image pickup device for taking in the subject formed as an image by the lens 52 as an image signal. The reference numeral 55 denotes the image signal processing circuit performing the analog signal processing of an image pickup signal (image signal) output from the solid state image pickup device 54. A reference numeral 56 denotes an A/D converter performing the analog-to-digital conversion of an image signal output from the image signal processing circuit 55. A reference numeral 57 denotes a signal processing unit that performs various corrections of image data output from the A/D converter 56 or compresses data. A reference numeral 58 denotes a timing generator outputting various timing signals to the solid state image pickup device 54, the image signal processing circuit 55, the A/D converter 56 and the signal processing unit 57. A reference numeral 59 denotes a whole control arithmetic operation unit controlling various operations and the whole still video camera. A reference numeral 60 denotes a memory unit for storing image data temporarily. A reference numeral 61 denotes an interface unit for performing recording to or reading from a recording medium 62. The reference numeral 62 denotes the detachably attachable recording medium such as a semiconductor memory for performing the recording or the reading of image data. A reference numeral 63 denotes an interface unit for performing the communication with an external computer and the like.

Next, the operation of the still video camera having the configuration mentioned above at the time of photographing is described. When the barrier 51 is opened, the main power supply is turned on. Subsequently, the power supply of a control system turns on, and furthermore the power supply of image pickup system circuits such as the A/D converter 56 is turned on. Then, in order to control a light exposure, the whole control arithmetic operation unit 59 makes the diaphragm (the mechanical shutter) 53 a full aperture. The signal output from the solid state image pickup device 54 is converted by the A/D converter 56 after passing the image signal processing circuit 55, and then is input into the signal processing unit 57. The whole control arithmetic operation unit 59 performs the operation of an exposure based on the data. The whole control arithmetic operation unit 59 judges brightness based on the result of having performed the light measurement, and controls the diaphragm 53 according to the result.

Next, based on the signal output from the solid state image pickup device 54, the whole control arithmetic operation unit 59 takes out high-frequency components, and calculates the distance to the subject. After that, the whole control arithmetic operation unit 59 drives the lens, and judges whether the lens is in focus or not. When the whole control arithmetic operation unit 59 judges that the lens is not in focus, the whole control arithmetic operation unit 59 again drives the lens to perform distance measurement. Then after the state of being in focus has been ascertained, the main exposure is started. When the exposure has been completed, the image signal output from the solid state image pickup device 54 receives the A/D conversion by the A/D converter 56 after passing the image signal processing circuit 55, and the converted image signal passes the signal processing unit 57 to be written in the memory unit 60 by the whole control arithmetic operation unit 59. After that, the data accumulated in the memory unit 60 passes the I/F unit controlling recording medium 61, and then the data is recorded in the detachably attachable recording medium 62 such as a semiconductor memory by the control of the whole control arithmetic operation unit 59. Moreover, the data may pass the external I/F unit 63 to be directly input into a computer or the like, and the processing of the image may be performed. The timing generator 58 controls the signals of the potential of FIG. 4.

Third Embodiment

Figure 6:
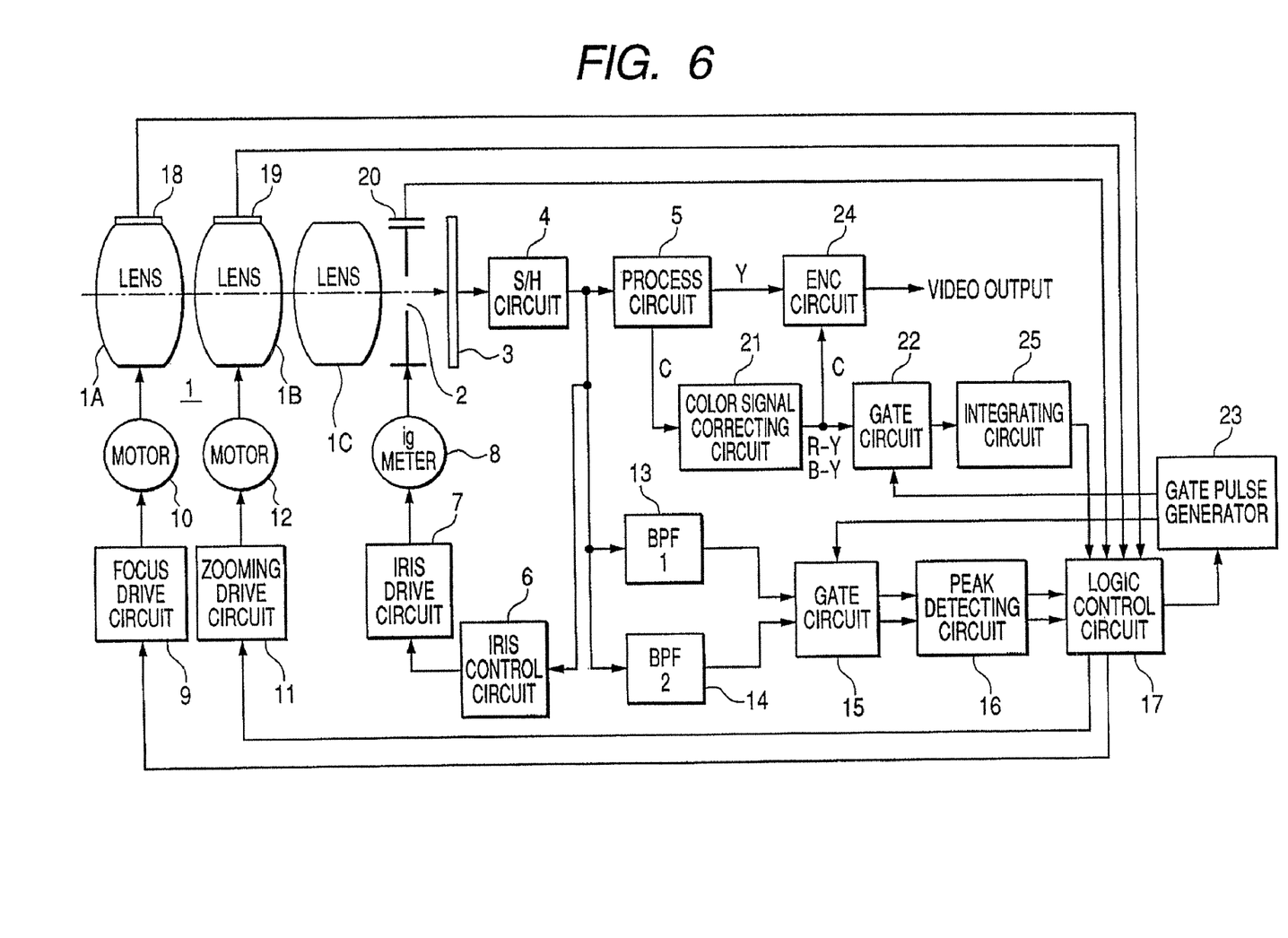
FIG. 6 is a block diagram showing a configuration example of a video camera according to a third embodiment of the present invention.

FIG. 6 is a block diagram showing a configuration example of a video camera according to a third embodiment of the present invention. Based on FIG. 6, an example of the case where the solid state image pickup device of the first embodiment is applied to the video camera is described in detail.

A reference numeral 1 denotes a taking lens equipped with a focus lens 1A for performing focusing, a zoom lens 1B for performing a zoom operation, and a lens 1C for forming an image. A reference numeral 2 denotes a diaphragm and mechanical shutter. A reference numeral 3 denotes a solid state image pickup device performing the photoelectric conversion of a subject image the image of which has been formed on an image pickup surface to convert the subject image into an electric image pickup signal. A reference numeral 4 denotes a sample hold circuit (S/H circuit) that performs the sample holding of the image pickup signal output from the solid state image pickup device 3 and further amplifies a level. The sample hold circuit 4 outputs an image signal.

A reference numeral 5 denotes a process circuit performing predetermined processing, such as gamma correction, color separation, blanking processing and the like, to the image signal output from the sample hold circuit 4. The process circuit 5 outputs a luminance signal Y and a chroma signal C. The chroma signal C output from the process circuit 5 receives the corrections of white balance and color balance by the color signal correction circuit 21, and is output as color difference signals R-Y and B-Y.

Moreover, the luminance signal Y output from the process circuit 5 and the color difference signals R-Y and B-Y output from the color signal correcting circuit 21 are modulated by an encoder circuit (ENC circuit) 24, and are output as a standard television signal. Then, the output standard television signal is supplied to a not shown video recorder, or an electronic view finder such as a monitor electronic view finder (EVF).

Subsequently, a reference numeral 6 denotes an iris control circuit, and the iris control circuit 6 controls an iris drive circuit 7 based on an image signal supplied from the sample hold circuit 4 to perform the automatic control of an ig meter 8 in order to control the opening quantity of the iris 2 so that the level of an image signal may be a constant value of a predetermined level.

Reference numerals 13 and 14 denote band pass filters (BPF) each having a different band limit for extracting high high-frequency components necessary for performing the in-focus detection among the image signals output from the sample hold circuit 4. The signals output from the first band pass filter 13 (BPF1) and the second band pass filter 14 (BPF2) are gated by each of a gate circuit 15 and a focus gate frame signal, and the peak values of the signals are detected by a peak detecting circuit 16 to be held by the circuit 16 and to be input into a logic control circuit 17. The signals of the peak values are called as focus voltages, and the focus is adjusted with the focus voltages.

Moreover, a reference numeral 18 denotes a focus encoder detecting the moving position of the focus lens 1A. A reference numeral 19 denotes a zoom encoder detecting the focus distance of the zoom lens 1B. A reference numeral 20 denotes an iris encoder detecting the opening quantity of the iris 2. The detected values of these encoders are supplied to a logic control circuit 17 performing system control.

The logic control circuit 17 performs the in-focus detection of a subject based on the image signal corresponding in a set in-focus detection region, and performs focusing. That is, the logic control circuit 17 takes in the peak value information of the high-frequency components supplied from each of the band path filters 13 and 14, and control signals, and controls a focus drive circuit 9 by supplying control signals of rotation directions, rotation speeds, rotations/stops and the like to the focus drive circuit 9 in order to drive the focus lens 1A to the position where the peak values of the high-frequency components become the maximum.

When zooming is instructed, a zooming drive circuit 11 rotates a zooming motor 12. When the zooming motor 12 rotates, the zoom lens 1B moves, and the zooming is performed.

As described above, according to the first to the third embodiments, the photodiode PD1 and the additional capacitor Cs1 constitute one pixel, and the photodiode PD2 and the additional capacitor Cs2 constitute another pixel. Because the source follower transistor SF-MOS, the selection transistor SEL-MOS and the reset transistor RES-MOS can be shared by these two pixels, the number of the elements to be used can be reduced, and the cost can be reduced.

Moreover, because the carriers overflowing the photodiodes PD1 and PD2 flow into the additional capacities Cs1 and Cs2 through the fixed potential barriers 101 and 102, respectively, the noises of the pixel signals can be reduced without being influenced by the defects of the floating diffusions FD.

Moreover, as described above, the overflowing carriers are accumulated in the additional capacities Cs1 and Cs2, and the pixel signals are generated based on the accumulated carriers in the photodiodes PD1 and PD2 and the additional capacities Cs1 and Cs2. Thereby, the dynamic ranges of the pixel signals can be expanded as compared with the case of using only the accumulated carriers of the photodiodes PD1 and PD2.

The additional capacities Cs1 and Cs2 may be formed using electrodes of polysilicon or the like, and dielectrics, or may be formed by shielding the surface part of a photodiode structure. The additional capacities Cs1 and Cs2 may be carrier accumulating units as long as the units can accumulate carriers. However, because a larger capacity can be realized by using the electrodes and the dielectrics, it is preferable to use the electrode and the dielectrics.

Incidentally, any of the embodiments described above is only an example of concretization at the time of the implementation of the present invention, and the scope of the present invention should not be interpreted to be limited to the embodiments. That is, the present invention can be implemented in various forms without departing from the scope and the main features of the invention.

This application claims priority from Japanese Patent Application No. 2005-080347 filed on Mar. 18, 2005, which is hereby incorporated by reference herein.

What is claimed is:

1. A solid state image pickup device, comprising:
a group including an amplifying unit including an input portion, first and second photoelectric conversion regions, and first and second carrier accumulating units, wherein the first photoelectric conversion region, the second photoelectric conversion region, the first carrier accumulating unit, and the second carrier accumulating unit are connected to the input portion in parallel;
a first capacitor that holds carriers amplified by the amplifying unit;
a second capacitor that holds carriers amplified by the amplifying unit;
a third capacitor that holds carriers amplified by the amplifying unit;
a fourth capacitor that holds carriers amplified by the amplifying unit;
a first differential amplifier that outputs a voltage generated by performing a subtracting operation between voltages of the first and second capacitors;
a second differential amplifier that outputs a voltage generated by performing a subtracting operation between voltages of the third and fourth capacitors;
an adder that adds output signals from the first and second differential amplifiers; and
an amplifier that amplifies a signal generated by addition in the adder.

2. The solid state image pickup device according to claim 1, wherein the group further includes:
a first transfer unit that connects the input portion with the first photoelectric conversion region;
a second transfer unit that connects the input portion with the first carrier accumulating unit;
a third transfer unit that connects the input portion with the second photoelectric conversion region; and
a fourth transfer unit that connects the input portion with the second carrier accumulating unit.

3. The solid state image pickup device according to claim 1, wherein the group further includes:
a third photoelectric conversion region;
a fourth photoelectric conversion region;
a third carrier accumulating unit; and
a fourth carrier accumulating unit, and
wherein the third photoelectric conversion region, the fourth photoelectric conversion region, the third carrier accumulating unit, and the fourth carrier accumulating unit are connected to the input portion in parallel.

4. The solid state image pickup device according to claim 3, wherein the group further includes:
a first transfer unit that connects the input portion with the first photoelectric conversion region;
a second transfer unit that connects the input portion with the first carrier accumulating unit;
a third transfer unit that connects the input portion with the second photoelectric conversion region;
a fourth transfer unit that connects the input portion with the second carrier accumulating unit;
a fifth transfer unit that connects the input portion with the third photoelectric conversion region;
a sixth transfer unit that connects the input portion with the third carrier accumulating unit;
a seventh transfer unit that connects the input portion with the fourth photoelectric conversion region; and
a eighth transfer unit that connects the input portion with the fourth carrier accumulating unit.

5. The solid state image pickup device according to claim 1, wherein the group further includes:
a first fixed potential barrier arranged at a non-active region between the first photoelectric conversion region and the first carrier accumulating unit; and
a second fixed potential barrier arranged at a non-active region between the second photoelectric conversion region and the second carrier accumulating unit.

6. The solid state image pickup device according to claim 5, wherein the first and second fixed potential barriers have an impurity concentration different from those of periphery regions thereof.

7. The solid state image pickup device according to claim 1, wherein the group further includes:
a first transfer unit that connects the input portion with the first photoelectric conversion region;
a second transfer unit that connects the input portion with the first carrier accumulating unit;
a third transfer unit that connects the input portion with the second photoelectric conversion region;
a fourth transfer unit that connects the input portion with the second carrier accumulating unit;
a first fixed potential barrier arranged at a non-active region between the first photoelectric conversion region and the first carrier accumulating unit; and
a second fixed potential barrier arranged at a non-active region between the second photoelectric conversion region and the second carrier accumulating unit, wherein
during a period of accumulating a carrier in the first photoelectric conversion region, the potential of the first fixed potential barrier is higher than the potential of the first transfer unit, and,
during a period of accumulating a carrier in the first photoelectric conversion region, the potential of the second fixed potential barrier is higher than the potential of the third transfer unit.

8. The solid state image pickup device according to claim 1, wherein the group further includes a reset unit connected to the input portion.

9. The solid state image pickup device according to claim 1, further comprising a pixel signal generating unit that generates a first pixel signal based on a carrier accumulated in the first photoelectric conversion region and the first carrier accumulating unit, and that generates a second pixel signal based on a carrier accumulated in the second photoelectric conversion region and the second carrier accumulating unit.

10. The solid state image pickup device according to claim 1, wherein the amplifier amplifies the signal generated by the addition in the adder according to an ISO sensitivity.

11. The solid state image pickup device according to claim 1, wherein
the first carrier accumulating unit includes a capacitor formed by a first impurity semiconductor region and an electrode of a polysilicon material, and
the second carrier accumulating unit includes a capacitor formed by a second impurity semiconductor region and an electrode of a polysilicon material.

12. The solid state image pickup device according to claim 1, wherein the group further comprises:
a first transfer unit that connects the input portion of with the first photoelectric conversion region;
a second transfer unit that connects the input portion with the first carrier accumulating unit;
a third transfer unit that connects the input portion with the second photoelectric conversion region; and a fourth transfer unit that connects the input portion with the second carrier accumulating unit, wherein the first carrier accumulating unit includes a capacitor formed by a first semiconductor impurity region and an electrode of a polysilicon material, the second carrier accumulating unit includes a capacitor formed by a second impurity semiconductor region and an electrode of a polysilicon material, the second transfer unit comprises a transistor, the fourth transfer unit comprises a transistor, the first semiconductor impurity region is a source of the transistor of the second transfer unit, and the second semiconductor impurity region is a source of the transistor of the fourth transfer unit.

13. The solid state image pickup device according to claim 1, wherein the solid state image pickup device is incorporated in a camera that includes:

a lens that focuses an optical image onto the solid state image pickup device; and a diaphragm that varies the light quantity passing through the lens.

14. The solid state image pickup device according to claim 1, further comprising a plurality of the groups, wherein the plurality of the groups are arranged two dimensionally.

* * * * *